July 17, 1962 W. M. CAREY, JR 3,045,127
ELECTRICAL COUNTER CIRCUITRY
Filed March 28, 1958
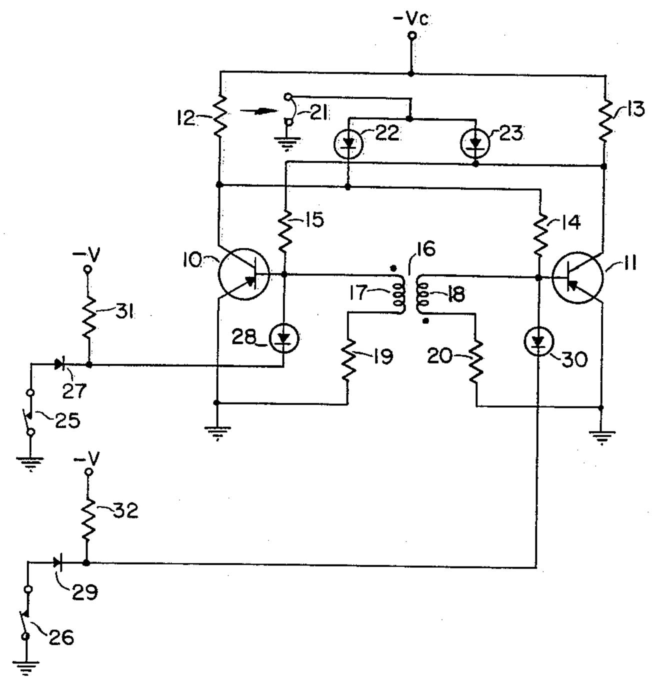
INVENTOR.
WILLIAM M. CAREY JR
BY Henry L. Hanson
ATTORNEY United States Patent Office 3,045,127
Patented July 17, 1962

3,045,127
ELECTRICAL COUNTER CIRCUITRY

William M. Carey, Jr., South Lincoln, Mass., assignor to Minneapolis-Honeywell Regulator Company, Minneapolis, Minn., a corporation of Delaware
Filed Mar. 28, 1958, Ser. No. 724,541
9 Claims. (Cl. 307—88.5)

A general object of the present invention is to provide a new and improved binary counter stage useful in the handling of digital information. More specifically, the present invention is concerned with a new and improved binary counter circuit which is characterized by its high speed of operation, its extreme tolerance of variations in circuit component values and its ability to operate with input trigger or switching pulses having widely varying characteristics.

Binary counter circuits are widely used in various counting configurations in digital data processing equipment. These stages may take the form of a bistable flip-flop having a single input to which trigger pulses may be applied. These stages normally switch from one bistable state to the other upon the application of successive input pulses. It has been conventional heretofore to require that each individual element of any such computer circuit embody elements of "computer" quality in order that the circuit be operative. Further, the voltages associated with such a circuit have had to be held to very close tolerances in order to have a circuit which will function properly. These stringent requirements have made prior types of circuits expensive to build and maintain. The present binary counter circuit is one which is capable of performing with very favorable timing characteristics and close performance specifications without requiring the closeness of circuit element specifications and supply voltage specifications heretofore demanded in such circuitry.

It is accordingly a further object of the present invention to provide a binary counter stage which has very reliable operating characteristics without requiring tight specifications insofar as the selection of the circuit components is concerned.

The present invention incorporates a bistable transistor type circuit having the necessary bistable characteristic produced by cross-coupling of signals between the outputs and inputs of a pair of transistors in the circuit. In addition, the present invention incorporates a unique transformer coupling between the inputs of the transistors of the bistable circuit in such a manner that the circuit may be readily switched from one bistable state to the other. The switching of the circuit from one bistable state to the other in order to make the circuit operate as a binary counter is effected by way of a pair of asymmetrically conducting devices having an appreciable threshold of conduction. These devices are so coupled to the cross-coupling circuits that, upon the application of an input signal to a common terminal, a switching action in the circuit can be effected so that the circuit will switch from one bistable state to the other.

It is accordingly a still further more specific object of the present invention to provide a new and improved binary counter stage including a pair of transistors connected in a bistable circuit with cross-coupling between the transistors and transformer coupling between the inputs of the transistors in combination with a unique input control switching mechanism comprising a pair of asymmetrically conducting devices, having an appreciable threshold of conduction, connected to a common input terminal.

The foregoing objects and features of novelty which characterize the invention, as well as other objects of the invention, are pointed out with particularity in the claims annexed to and forming a part of the present specification. For a better understanding of the invention, its advantages and specific objects attained with its use, reference should be had to the accompanying drawings and descriptive matter in which there is illustrated and described a preferred embodiment of the invention.

Referring to the single FIGURE, the circuit will be seen to comprise a pair of transistors 10 and 11, both of said transistors having the normal base, emitter, and collector electrodes. Supplying power to the circuit is a suitable source, not shown, connected to a $-V_C$ power supply terminal and a ground terminal. As shown in the drawing, the emitter of each of the transistors 10 and 11 is connected to the ground circuit while the collectors of the two transistors are connected to the $-V_C$ terminal by way of a pair of load resistors 12 and 13, respectively. The output of the transistor 10 at the collector electrode thereof is connected to the base of the transistor 11 by way of the cross-coupling resistor 14 while the output collector electrode of the transistor 11 is coupled to the base of the transistor 10 by way of a cross-coupling resistor 15. The base-emitter circuit of the transistor 10 is transformer coupled to the base-emitter circuit of the transistor 11 by way of a transformer 16 having a pair of windings 17 and 18. In series with the winding 17 is a resistor 19 and in series with the winding 18 is a resistor 20.

The input for the circuit is by way of a pair of input terminals 21 which are coupled to a pair of silicon diodes 22 and 23. Normally, the potential of the ungrounded input terminal 21 will be floating or connected to a circuit having a relatively high impedance.

A pair of set inputs for the circuit are provided by way of grounding switches 25 and 26. The switch 25 is connected by way of a germanium diode 27 and silicon diode 28 to the base of transistor 10. The switch 26 is coupled by way of a germanium diode 29 and a silicon diode 30 to the base of the transistor 11. A resistor 31 couples a $-V$ bias supply terminal to the junction of the diodes 27 and 28. A resistor 32 couples the $-V$ bias supply terminal to the junction between the diodes 29 and 30.

In considering the operation of the present circuit it should first be noted that the resistors of the circuit are so selected that the circuit, without the input circuit or the transformer, will function as a bistable circuit. That is, the circuit is inherently unstable when power is applied thereto and will switch to a circuit condition where one of the transistors will be conducting and the other will be cut off. Such circuit instabilities are inherent in practically all bistable circuits in that the circuits will tend to switch to one or the other of two stable states. When the circuit has been switched to one of its stable states upon the application of power, the effect of the transformer 16 is negligible as it appears as a low resistance to direct current in both the windings 17 and 18.

In order to start the circuit out in a particular bistable state, one or the other of the set switches 25 or 26 may be opened. Thus, the opening of the switch 25 will permit the lower end of the resistor 31 to become more negative and exceed the conducting threshold potential of the diode 28. A current will then flow from the ground terminal through the emitter-base circuit of transistor 10, diode 28, and resistor 31 to the $-V$ bias terminal. This will switch the transistor 10 into the conducting state. In a similar manner, the opening of the switch 26 will be effective to switch the transistor 11 into the conducting state.

It is assumed first that the initial bistable state of the stage illustrated is such that the transistor 10 is conducting and the transistor 11 is cut off. When the transistor 10 is conducting, it will effectively be connecting the lower end of the load resistor 12 to ground and, by way of the resistor 14, effectively coupling the base of the transistor 11 to ground. With a negative potential supplied to the base of the transistor 10 by way of the resistors 13 and 15, the base 10 will remain conducting. Current will also be flowing through the winding 17 in a circuit that may be traced from the load resistor 13, through the resistor 15, winding 17, and resistor 19 to ground. Substantially no current will be flowing through the winding 18 for the reason that the upper terminal of the resistor 14 is effectively grounded by the shorting action of the transistor 10.

In order to switch the bistable state of the circuit, a grounding pulse will be applied to the input terminals 21. The presence of the grounding pulse will act, by way of the diode 23, to shunt part of the current flowing through the winding 17 and produce an inductive kick which will simultaneously switch the transistor 10 into the nonconducting state and the transistor 11 into the conductive state. In order to switch the circuit back against to its initial state, a further grounding pulse may be applied to the input terminals 21. This will then cause a drop in the current due to the diode 22 and the resultant drop in the current flow through the winding 18 will cause a reverse kick in the transformer which will have the effect of cutting off the transistor 11 and rendering the transistor 10 conducting.

Silicon diodes are selected for the diodes 22 and 23 for the reason that these diodes have an appreciable threshold of conduction. This is necessary for the reason that transistors 10 and 11 do have some resistance even when they are conducting in a saturated state. The magnitude of the voltage drop when the transistors are conducting may be in the neighborhood of 100 millivolts. When a silicon diode is used, this 100 millivolts will be less than the threshold of conduction of the diode and consequently the operation of the switching circuit will not be affected by the diode. In other words, when a grounding pulse is applied to the input terminals 21, if the transistor 10 should be conducting, the diode 22 will remain cut off for the reason that there is a voltage drop across the transistor 10. However, when the grounding pulse is applied, the diode 23 will be free to conduct and to produce the desired inductive kick in the transformer 16 necessary to the switching of the circuit from one bistable state to the other.

The present circuit will tolerate very wide variations in trigger pulse width due to the inherent time constant of the transformer 16. Further, the presence of the transformer 16 greatly enhances the speed at which the circuit is capable of switching from one stable state to the other. In addition, the circuit parameters are such that circuit components may be selected having ranges of values which may vary considerably without affecting the over-all operation of the circuit. In the same manner, the supply voltages used by the circuit also need not be maintained or regulated at any particular critical point.

While, in accordance with the provisions of the statutes, there has been illustrated and described the best forms of the invention known, it will be apparent to those skilled in the art that changes may be made in the apparatus described without departing from the spirit of the invention as set forth in the appended claims and that in some cases, certain features of the invention may be used to advantage without a corresponding use of other features.

Having now described the invention, what is claimed as new and novel and for which it is desired to secure Letters Patent is:

1. A binary counter circuit comprising a pair of transistor circuits, each having an input and an output circuit, a pair of coupling circuits, one coupling circuit connecting the output of one of said transistor circuits to the input of the other of said transistor circuits, the other coupling circuit connecting the output of the other of said transistor circuits to the input of said one transistor circuit, a single transformer means coupled between the inputs of said transistor circuits, said transformer means comprising a pair of windings each of which is directly coupled to one each of the inputs of said pair of transistor circuits, and a single trigger input circuit connected to said pair of coupling circuits to switch the conducting state between said pair of transistor circuits each time an input trigger signal is applied.

2. A binary counter circuit comprising a pair of transistor circuits, each having an input and an output circuit, a pair of coupling circuits, one coupling circuit connecting the output of one of said transistor circuits to the input of the other of said transistor circuits, the other coupling circuit connecting the output of the other of said transistor circuits to the input of said one transistor circuit, a single transformer means comprising a pair of windings directly coupling the inputs of said transistor circuits, and a single trigger input circuit connected to said pair of coupling circuits to switch the conducting state between said pair of transistor circuits each time an input trigger signal is applied, said single trigger input circuit comprising a pair of asymmetrically conducting devices connected one each to said coupling circuit from a common input terminal and having a threshold of conduction in excess of 100 millivolts.

3. A binary counter circuit comprising a pair of transistor circuits, each having an input and an output circuit, a pair of coupling circuits, one coupling circuit connecting the output of one of said transistor circuits to the input of the other of said transistor circuits, the other coupling circuit connecting the output of the other of said transistor circuits to the input of said one transistor circuit, a single transformer means comprising a pair of transformer windings directly coupled to each other and coupled directly between the inputs of said transistor circuits, and a single trigger input circuit connected to said pair of coupling circuits to switch the conducting state between said pair of transistor circuits each time an input trigger signal is applied, said input trigger circuit comprising a pair of silicon diodes having like terminals connected together to a common input and to separate outputs on said pair of coupling circuits.

4. A binary counter stage comprising a first transistor having a base, emitter, and collector, a second transistor having a base, emitter, and collector, a pair of power supply terminals, a first resistor connecting the emitter-collector circuit of said first transistor to said power supply terminals, a second resistor connecting the emitter-collector circuit of said second transistor to said power supply terminals, a third resistor connecting the collector of said first transistor to the base of said second transistor, a fourth resistor connecting the collector of said second transistor to the base of said first transistor, a single transformer means coupling the base-emitter circuits of said first and second transistors, said transformer means comprising a pair of windings each connected directly to the base-emitter circuits of said transistors, and a single input circuit coupled to the collectors of said first and second transistors, said input circuit being adapted to switch said stage between one or the other of two bistable states upon the application of input trigger pulses.

5. A binary counter stage comprising a first transistor having a base, emitter, and collector, a second transistor having a base, emitter, and collector, a pair of power supply terminals, a first resistor connecting the emitter-collector circuit of said first transistor to said power supply terminals, a second resistor connecting the emitter-collector circuit of said second transistor to said power supply terminals, a third resistor connecting the collector of said first transistor to the base of said second transistor, a fourth resistor connecting the collector of said second transistor to the base of said first transistor, a pair of transformer windings coupled to each other, one each being connected to the base-emitter circuits of each of said first and second transistors, and a single input circuit coupled to the collectors of said first and second transistors exclusive of said transformer windings, said input circuit being adapted to switch said stage between one or the other of two bistable states upon the application of input trigger pulses.

6. A binary counter stage comprising a first transistor having a base, emitter, and collector, a second transistor having a base, emitter, and collector, a pair of power supply terminals, a first resistor connecting the emitter-collector circuit of said first transistor to said power supply terminals, a second resistor connecting the emitter-collector circuit of said second transistor to said power supply terminals, a third resistor connecting the collector of said first transistor to the base of said second transistor, a fourth resistor connecting the collector of said second transistor to the base of said first transistor, a single transformer means comprising a pair of windings directly coupling the base-emitter circuits of said first and second transistors, and a single input circuit coupled to the collectors of said first and second transistors, said input circuit comprising a pair of silicon diodes having like terminals on one side connected to an input terminal and on the other side to the collectors of said transistors and being adapted to switch said stage between one or the other of two bistable states upon the application of input trigger pulses.

7. A cross coupling circuit for a bistable circuit including a pair of electrical stages each having an input and being adapted to be alternately switched to be conducting comprising a single transformer means having a pair of windings directly coupled between the inputs of said stages, and a pair of silicon diodes coupled to said input circuits and to a common input terminal.

8. A cross coupling circuit for a bistable circuit including a pair of electrical stages each having an input and being adapted to be alternately conducting comprising a single transformer means having a pair of windings coupled to each other and being coupled between the inputs of said stages, and a pair of diodes having a threshold of conduction in excess of 100 millivolts coupled to said input circuits and to a common input terminal.

9. A cross-coupling circuit for a bistable circuit including a pair of electrical stages each having an iput and transistor means adapted to be alternately switched into conduction, comprising a single transformer means having a pair of electrical stages each having an input and of said stages, and a pair of diodes coupled to said input circuits and to a common input terminal and having a threshold of conduction in excess of that of said transistor means.

References Cited in the file of this patent

UNITED STATES PATENTS

| | | |
|---|---|---|
| 2,422,449 | Usselman | June 17, 1947 |
| 2,485,395 | Lord | Oct. 18, 1949 |
| 2,759,104 | Skellett | Aug. 14, 1956 |
| 2,764,688 | Grayson et al. | Sept. 25, 1956 |
| 2,782,309 | Aasma | Feb. 19, 1957 |
| 2,787,712 | Priebe et al. | Apr. 2, 1957 |
| 2,802,941 | McConnell | Aug. 13, 1957 |
| 2,819,394 | Gordon | Jan. 7, 1958 |
| 2,831,127 | Braicks | Apr. 15, 1958 |
| 2,840,728 | Haugk | June 24, 1958 |
| 2,909,675 | Edson | Oct. 20, 1959 |